(12) United States Patent
Dong

(10) Patent No.: US 11,571,717 B2
(45) Date of Patent: Feb. 7, 2023

(54) WAFER CLEANING APPARATUS AND WAFER CLEANING METHOD

(71) Applicant: CHANGXIN MEMORY TECHNOLOGIES, INC., Hefei (CN)

(72) Inventor: Peng Dong, Hefei (CN)

(73) Assignee: CHANGXIN MEMORY TECHNOLOGIES, INC., Anhui (CN)

( * ) Notice: Subject to any disclaimer, the term of this patent is extended or adjusted under 35 U.S.C. 154(b) by 0 days.

(21) Appl. No.: 17/593,129

(22) PCT Filed: May 8, 2021

(86) PCT No.: PCT/CN2021/092285
§ 371 (c)(1),
(2) Date: Sep. 9, 2021

(87) PCT Pub. No.: WO2021/233139
PCT Pub. Date: Nov. 25, 2021

(65) Prior Publication Data
US 2022/0266308 A1    Aug. 25, 2022

(30) Foreign Application Priority Data
May 18, 2020   (CN) .......................... 202010420354.7

(51) Int. Cl.
*B08B 1/00*     (2006.01)
*A46B 13/02*    (2006.01)
(Continued)

(52) U.S. Cl.
CPC .............. *B08B 1/002* (2013.01); *A46B 13/02* (2013.01); *A46D 1/0207* (2013.01); *B08B 1/04* (2013.01);
(Continued)

(58) Field of Classification Search
CPC ......... H01L 21/67046; H01L 21/02057; A46B 13/02; B08B 1/002; B08B 1/04; A46D 1/0207
See application file for complete search history.

(56) References Cited

U.S. PATENT DOCUMENTS

2002/0072016 A1    6/2002   Chen et al.

FOREIGN PATENT DOCUMENTS

| CN | 203721680 U | 7/2014 |
| CN | 105957821 A | 9/2016 |

(Continued)

OTHER PUBLICATIONS

Written Opinion of the International Searching Authority (WO/ISA) and International Search Report (ISR) in Application No. PCT/CN2021/092285, dated Jul. 26, 2021.

*Primary Examiner* — Shay Karls
(74) *Attorney, Agent, or Firm* — Syncoda LLC; Feng Ma

(57) ABSTRACT

A wafer cleaning apparatus includes: a brush, configured to wash a surface to be cleaned of a wafer; a base for carrying the brush, the base having at least one conductive disk, a disk surface of the conductive disk being parallel to the surface to be cleaned, and the base being able to rotate around an axis of the base; and a magnetic field generation structure configured to emit, to the conductive disk, a magnetic field perpendicular to the disk surface of the conductive disk, so that an induced electric field is generated in the conductive disk during the rotation of the base. The quality of wafer cleaning and the yield of wafer products can be improved.

19 Claims, 2 Drawing Sheets

(51) Int. Cl.
*A46D 1/00* (2006.01)
*B08B 1/04* (2006.01)
*H01L 21/02* (2006.01)
*H01L 21/67* (2006.01)

(52) U.S. Cl.
CPC .. *H01L 21/02057* (2013.01); *H01L 21/67046* (2013.01); *A46B 2200/3073* (2013.01)

(56) References Cited

FOREIGN PATENT DOCUMENTS

| | | | |
|---|---|---|---|
| CN | 208398281 U | 1/2019 | |
| JP | 3838436 B2 * | 10/2006 | ............. H02K 31/02 |

* cited by examiner

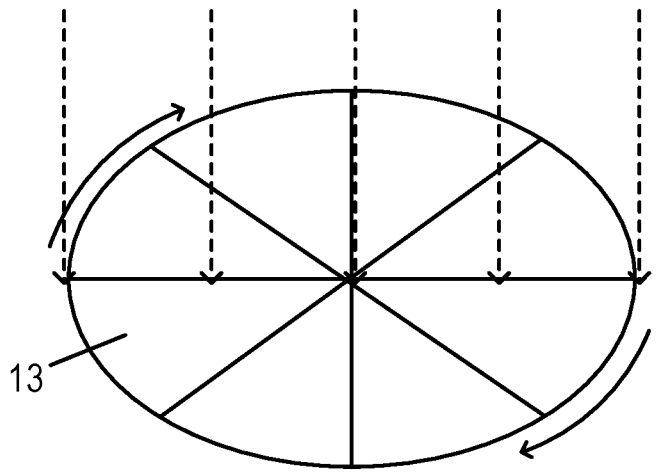

FIG. 3

```
┌─────────────────────────────────────────┐
│ Provide a wafer cleaning apparatus      │─── S41
└─────────────────────────────────────────┘
                    │
┌─────────────────────────────────────────┐
│ While washing the surface to be cleaned by the brush, │
│ drive the base to rotate around the axis of the base and │
│ also drive the magnetic field generation structure to emit │─── S42
│ the magnetic field to generate an induced electric field in │
│ the conductive disk during the rotation of the base │
└─────────────────────────────────────────┘
```

FIG. 4

WAFER CLEANING APPARATUS AND WAFER CLEANING METHOD

CROSS-REFERENCE TO RELATED APPLICATIONS

This application is a national stage of International Application No. PCT/CN2021/092285 filed on May 8, 2021, which claims priority to Chinese Patent Application No. 202010420354.7 filed on May 18, 2020. The disclosures of these applications are hereby incorporated by reference in their entirety.

TECHNICAL FIELD

The present disclosure relates to a wafer cleaning apparatus and a wafer cleaning method.

BACKGROUND

During the semiconductor manufacturing process, due to the van der Waals force and electrostatic force in various complex processes, a large amount of tiny dust particles, metal ions, organic matter, etc., may be adsorbed on the back side of the wafer, resulting in wafer defects which will seriously affect the yield and finished product ratio of semiconductor devices.

In order to solve this problem, the main method for back side treatment (BST) of the wafer is to combine brush washing with deionized water spraying.

Therefore, how to avoid the adsorption of particles during the cleaning of the backside of the wafer so as to improve the yield of wafer products is a technical problem that needs to be solved urgently.

SUMMARY

According to various embodiments, the present disclosure provides a wafer cleaning apparatus, comprising:

a brush, configured to wash a surface to be cleaned of a wafer;

a base for carrying the brush, the base having at least one conductive disk, a disk surface of the conductive disk being parallel to the surface to be cleaned, and the base being able to rotate around an axis of the base; and a magnetic field generation structure configured to emit, to the conductive disk, a magnetic field perpendicular to the disk surface of the conductive disk, so that an induced electric field is generated in the conductive disk during the rotation of the base.

In some embodiments, the wafer comprises a front side on which a device structure is formed and a back side opposite to the front side, the surface to be cleaned being the back side of the wafer.

In some embodiments, there is one conductive disk and the axis of the conductive disk coincides with the axis of the base.

In some embodiments, the shape of the conductive disk is a circle, an ellipse or an arbitrary polygon.

In some embodiments, there are multiple conductive disks and the multiple conductive disks are symmetrically distributed with respect to the axis of the base.

In some embodiments, the shape of the conductive disk is a sector and the multiple conductive disks are in contact with each other to form a circular disk shape.

In some embodiments, in a direction perpendicular to the base, the projection of the conductive disk is at least partially located on the periphery of the projection of the brush.

In some embodiments, a plurality of the brushes are simultaneously connected to the surface of the base; and in a direction perpendicular to the base, the projection of the conductive disk covers the projection of the brush and extends to the outside of the projection of the brush.

In some embodiments, a plurality of the brushes are simultaneously connected to the surface of the base, and the projection of the conductive disk is located only between two adjacent brushes.

In some embodiments, the area of the disk surface of the conductive disk facing the wafer is equal to the cross-sectional area of the base along the disk surface.

In some embodiments, the conductive disk is embedded in the base.

In some embodiments, the conductive disk is located on a surface of the base facing the brush.

In some embodiments, the conductive disk is made of an organic conductive material or a metal material.

In some embodiments, the wafer cleaning apparatus further comprises:

a controller, connecting the base to the magnetic field generation structure, and configured to adjust one or more of the rotation speed of the base, the rotation direction of the base, the direction of the magnetic field, and the intensity of the magnetic field.

In some embodiments, the brush is a conductive brush.

In some embodiments, the brush comprises:

a washing portion, configured to come into contact with the surface to be cleaned of the wafer, the washing portion is made of a conductive material; and a connection portion, configured to connect the washing portion to the base.

In some embodiments, the washing portion is made of a blended copolymer of graphene oxide or carbon nanotubes and polyvinyl alcohol.

In some embodiments, the mass ratio of graphene oxide or carbon nanotubes to polyvinyl alcohol is 0.05% to 0.25%.

In order to solve the problem mentioned above, the present disclosure further provides a wafer cleaning method, comprising:

providing a wafer cleaning apparatus described above;

while washing the surface to be cleaned by the brush, driving the base to rotate around the axis of the base and also driving the magnetic field generation structure to emit the magnetic field to generate an induced electric field in the conductive disk during the rotation of the base.

In some embodiments, the method further comprises:

adjusting one or more of the rotation speed of the base, the rotation direction of the base, the direction of the magnetic field, and the intensity of the magnetic field to change the magnitude and/or direction of the induced electric field.

In the wafer cleaning apparatus and wafer cleaning method according to the present disclosure, a conductive disk is provided in a base for carrying a brush, and the rotation of the base is used to drive the rotation of the conductive disk, so that the conductive disk can cut a magnetic field perpendicular to the disk surface of the conductive disk, thereby forming a potential difference between the center and the edge of the conductive disk to generate an induced electric field by which the electrostatic charges on the surface to be cleaned of the wafer are adsorbed. Therefore, the adsorption of particles in the external environment on the surface to be cleaned is reduced or even avoided, the quality of wafer cleaning is improved, and the yield of wafer products is improved.

BRIEF DESCRIPTION OF THE DRAWINGS

FIG. 3 is another schematic structure diagram of a conductive disk in a specific embodiment of the present disclosure; and FIG. 4 is a flowchart of a wafer cleaning method in a specific embodiment of the present disclosure.

DESCRIPTION OF THE EMBODIMENTS

Most of brushes are made of materials with poor conductivity. In this way, when the back side of the wafer is washed with a brush, the friction of the brush with the back side of the wafer will cause the accumulation of static electricity. The accumulated static electricity will adsorb the particles in the environment to the back side of the wafer or to the back side of the chuck for carrying the wafer. On the other hand, deionized water is quite low in conductivity, and the spraying of deionized water is not conducive to the release of electrostatic charges on the back side of the wafer.

The specific embodiments of the wafer cleaning apparatus and wafer cleaning method according to the present disclosure will be described in detail below with reference to the accompanying drawings.

Figure 1:
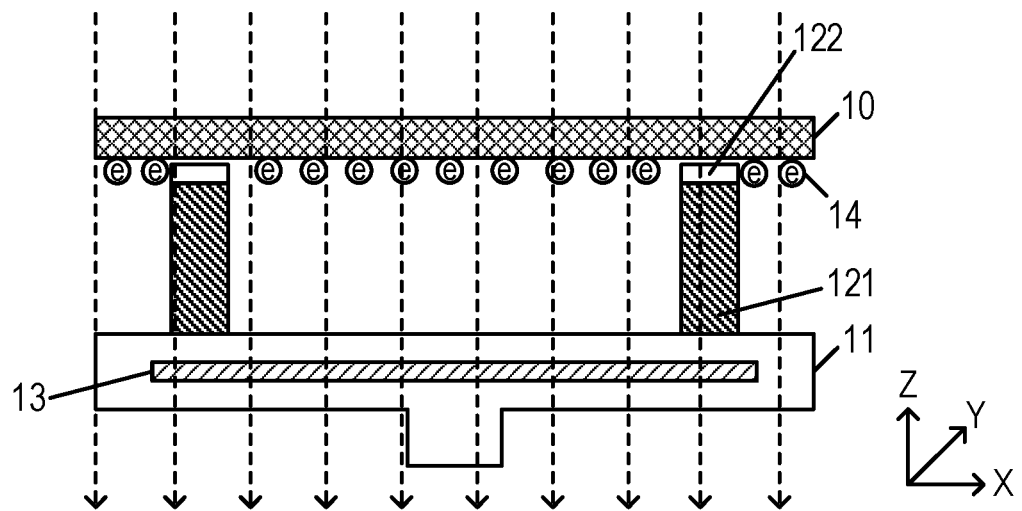
FIG. 1 is a schematic structure diagram of a wafer cleaning apparatus in a specific embodiment of the present disclosure.

This specific embodiment provides a wafer cleaning apparatus. FIG. 1 is a schematic structure diagram of the wafer cleaning apparatus in the specific embodiment of the present disclosure. As shown in FIG. 1, the wafer cleaning apparatus in this specific embodiment comprises:

a brush, configured to wash a surface to be cleaned of a wafer 10;

a base 11 for carrying the brush, the base 11 having at least one conductive disk 13, a disk surface of the conductive disk 13 being parallel to the surface to be cleaned, and the base 11 being able to rotate around an axis of the base; and a magnetic field generation structure configured to emit, to the conductive disk 13, a magnetic field perpendicular to the disk surface of the conductive disk 13, so that an induced electric field is generated in the conductive disk 13 during the rotation of the base 11.

Specifically, the wafer 10 may be a monocrystalline wafer, or a wafer with a device structure formed on its surface. Regardless of a monocrystalline wafer or a wafer with a device structure formed on its surface, the wafer 10 comprises a front side on which a device structure is formed and a back side opposite to the front side. In this specific embodiment, the back side of the wafer 10 is the surface to be cleaned. The brush comprises: a washing portion 122, configured to come into contact with the surface to be cleaned of the wafer 10; and a connection portion 121, configured to connect the washing portion 122 to the base 11. In the process of cleaning the surface to be cleaned of the wafer 10 by the wafer cleaning apparatus, the base 11 rotates around the axis of the base (for example, clockwise or counterclockwise), the rotation of the base 11 drives the rotation of the brush located thereon, so that the washing portion 122 rubs and washes the surface to be cleaned of the wafer 10 to remove residual contaminants on the surface to be cleaned.

The direction indicated by the dotted arrow in FIG. 1 is the direction of the magnetic field. In this specific embodiment, the conductive disk 13 is provided in the base 11 so that the base 11 can drive the conductive disk 13 to rotate while rotating around the axis of the base. The magnetic field generation structure emits, to the conductive disk 13, a magnetic field perpendicular to the disk surface of the conductive disk 13. For example, in FIG. 1, the disk surface of the conductive disk 13 is in the XY plane, and the direction of the magnetic field emitted by the magnetic field generation structure is the Z-axis direction.

In this specific embodiment, the description will be given by taking, as an example, the case where the direction of the magnetic field is the negative direction of the Z-axis (that is, vertically downward) and the rotation direction of the base 11 is the clockwise direction. When the base 11 rotates in the clockwise direction, it drives the conductive disk 13 to rotate in the clockwise direction too. The rotating conductive disk 13 cuts the magnetic lines of the magnetic field, so that positive charges are accumulated at the edge of the conductive disk 13 (that is, a high potential is formed at the edge), and negative charges are accumulated in the center of the conductive disk 13 (that is, a low potential is formed in the center). Thus, a potential difference is generated between the edge and the center of the conductive disk 13 to form an induced electric field. After the induced electric field is formed, the electrostatic charges 14 on the surface to be cleaned can be adsorbed, so that the electrostatic charges 14 accumulated on the surface to be cleaned are directed to the high-potential area or the low-potential area on the conductive disk 13 to separate from the surface of the wafer 10. Thus, the electrostatic charges 14 on the surface to be cleaned are reduced, the adsorption of particles in the external environment by the wafer 10 during the cleaning process is avoided, the quality of wafer cleaning is improved, and the yield of wafer products is improved. This is merely an example. It is possible for those skilled in the art to set the direction of the magnetic field as the positive direction of the Z-axis (i.e., vertically upward) according to actual needs. The rotation direction of the base 11 may be a counterclockwise direction.

In this specific embodiment, the conductive disk 13 may be made of an organic conductive material or a metal material, which may be determined by those skilled in the art according to actual needs.

In some embodiments, there is one conductive disk 13 and the axis of the conductive disk 13 coincides with the axis of the base 11.

Figure 2:
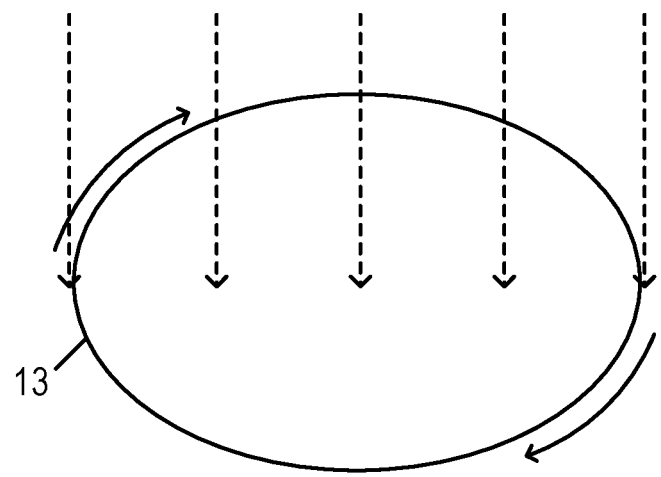
FIG. 2 is a schematic structure diagram of a conductive disk in a specific embodiment of the present disclosure.

FIG. 2 is a schematic structure diagram of a conductive disk in a specific embodiment of the present disclosure. Specifically, there may be only one conductive disk 13, and the shape of the conductive disk 13 may be a circle, an ellipse, or an arbitrary polygon. FIG. 2 shows a schematic view when the shape of the conductive disk 13 is a circular. In FIG. 2, the dashed arrow indicates the direction of the magnetic field, and the solid arrow indicates the rotation direction of the conductive disk 13. The axis of the conductive disk 13 coincides with the axis of the base 11, that is, the projection of the center of the conductive disk 13 coincides with the projection of the center of the base 11. In this way, during the rotation of the base 11, the conductive disk 13 also rotates around the axis of the base 11. In order to enable the conductive disk 13 to adsorb as much electrostatic charges 14 on the surface to be cleaned as possible, the area of the disk surface of the conductive disk 13 facing the wafer 10 may be equal to the cross-sectional area of the base 11 along the disk surface. The shape and/or size of the conductive disk 13 may be adjusted by those skilled in the art according to actual needs.

In some embodiments, there are multiple conductive disks 13 and the multiple conductive disks 13 are symmetrically distributed with respect to the axis of the base 11.

In some embodiments, the shape of the conductive disk 13 is a sector and the multiple conductive disks 13 are in contact with each other to form a circular disk shape.

FIG. 3 is another schematic structure diagram of a conductive disk in a specific embodiment of the present disclosure. FIG. 3 shows a schematic view when the shape of the conductive disk 13 is a sector and there are eight conductive disks 13. In FIG. 3, the dashed arrow indicates the direction of the magnetic field, and the solid arrow indicates the rotation direction of the conductive disk 13. When there are multiple conductive disks 13, the multiple conductive disks 13 may be symmetrically distributed with respect to the axis of the base 11, so that the multiple conductive disks 13 are combined into a circle, an ellipse or an arbitrary polygon by contacting each other, and the axis of the combined pattern coincides with the axis of the base 11.

FIG. 3 is an example in which multiple sectored conductive disks 13 contact with each other by their circle centers to form a circle. The shape and/or size of the conductive disks 13 may be adjusted by those skilled in the art according to actual needs, so that the multiple conductive disks 13 contact with each other to form a circular ring. The shape formed by combining the multiple conductive disks 13 is not limited in this specific embodiment.

In some embodiments, in a direction perpendicular to the base 11, the projection of the conductive disk 13 is at least partially located on the periphery of the projection of the brush.

Specifically, in order to enable the electrostatic charges 14 on the surface to be cleaned of the wafer 10 to sufficiently move to the base 11, so as to reduce the residual electrostatic charges 14 on the surface to be cleaned as much as possible, the projection of the conductive disk 13 is at least partially located on the periphery of the projection of the brush. For example, a plurality of the brushes may be simultaneously connected to the surface of the base 11, and the projection of the conductive disk 13 may be located only between two adjacent brushes; or, in the direction perpendicular to the base 11, the projection of the conductive disk 13 covers the projection of the brush and extends to the outside of the projection of the brush. The word "multiple" used in this specific embodiment refers to two or more.

In some embodiments, the conductive disk 13 is embedded in the base 11; or
the conductive disk 13 is located on a surface of the base 11 facing the brush.

Specifically, the specific position of the conductive disk 13 in the base 11 may be adjusted by those skilled in the art according to actual needs. For example, embedding the conductive disk 13 in the base 11 may avoid damage to the conductive disk 13 caused by chemical cleaning agents or deionized water in the process of cleaning the wafer 10; and the arrangement of the conductive disk 13 on the surface of the base 11 facing the brush is convenient to adjust the shape, size or material of the conductive disk 13 according to actual needs.

In some embodiments, the wafer cleaning apparatus further comprises:
a controller, connecting the base to the magnetic field generation structure, and configured to adjust one or more of the rotation speed of the base 11, the rotation direction of the base 11, the direction of the magnetic field, and the intensity of the magnetic field.

Specifically, the conductive disk 13 generates an induced electric field by cutting magnetic induction lines. The intensity of the induced electric field generated depends upon the intensity of the magnetic field emitted by the magnetic field generation structure and the rotation speed of the conductive disk 13. The direction of the induced electric field depends upon the direction of the magnetic field and the rotation direction of the conductive disk 13. The magnitude of force applied to the electrostatic charges 14 on the surface to be cleaned of the wafer 10 by the induced electric field depends upon the intensity of the induced electric field and the quantity of charges of the electrostatic charges 14, and the direction of the force depends upon the direction of the induced electric field. Therefore, by adjusting one or more of the rotation speed of the base 11, the rotation direction of the base 11, the direction of the magnetic field, and the intensity of the magnetic field, the size and/or direction of the induced electric field may be adjusted. Thus, the magnitude and direction of the force applied to the electrostatic charges 14 on the surface of the wafer 10 are adjusted. The flexibility in using the wafer cleaning apparatus is improved.

In some embodiments, the brush is a conductive brush.

Specifically, in order to reduce the accumulation of electrostatic charges 14 generated in the process of rubbing and washing the surface to be cleaned of the wafer 10 by the brush, the conductivity of the washing portion 122 of the brush may be enhanced. For example, a conductive material is used to form the washing portion 122.

For example, the washing portion 122 is made of a blended copolymer of graphene oxide (GO) or carbon nanotubes (CNT) and polyvinyl alcohol (PVA). Polyvinyl alcohol has poor conductivity. However, the blended copolymer of graphene oxide or carbon nanotubes and polyvinyl alcohol has good conductivity. This is because graphene oxide or carbon nanotubes contain a large number of hydroxyl groups (—OH) and carboxyl groups (—COOH), while polyvinyl alcohol has hydroxyl groups. Therefore, during the blended copolymerization of graphene oxide or carbon nanotubes with vinyl alcohol, the hydroxyl groups and carboxyl groups in graphene oxide or carbon nanotubes will have a strong hydrogen-bond reaction with the hydroxyl groups in polyvinyl alcohol. Graphene oxide or carbon nanotubes have good compatibility with polyvinyl alcohol, so that graphene oxide or carbon nanotubes can be fully dispersed in the polyvinyl alcohol matrix, thereby improving the conductivity of polyvinyl alcohol.

The method for the blended copolymerization of graphene oxide or carbon nanotubes with polyvinyl alcohol may be as follows: graphene oxide or carbon nanotubes are first dissolved in deionized water, uniformly distributed by ultrasonic vibration, added with dimethyl sulfoxide (DMSO) and polyvinyl alcohol resin, and stirred at room temperature for 1 hour to make them evenly mixed. The volume ratio of deionized water to dimethyl sulfoxide is 3:7. The mass ratio of graphene oxide or carbon nanotubes to polyvinyl alcohol is 0.05% to 0.25%. Then, the uniformly mixed solution is pressurized and heated to 110° C. Finally, after evacuating to 0.1 MPa to 0.01 MPa, the dissolved solution is injected into a mold for defoaming to form the washing portion 122. This is only an example. The process flow and process parameters may be adjusted by those skilled in the art according to actual needs.

The specific embodiment further provides a wafer cleaning method. FIG. 4 is a flowchart of a wafer cleaning method in a specific embodiment of the present disclosure. The wafer cleaning method in this specific embodiment may be implemented by the wafer cleaning apparatus as shown in FIGS. 1-3. As shown in FIG. 1 to FIG. 4, the wafer cleaning method according to this specific embodiment comprises:

S41: providing a wafer cleaning apparatus described above;

S42: while washing the surface to be cleaned by the brush, driving the base 11 to rotate around the axis of the base and also driving the magnetic field generation structure to emit the magnetic field to generate an induced electric field in the conductive disk 13 during the rotation of the base 11.

In some embodiments, the wafer cleaning method further comprises:

adjusting one or more of the rotation speed of the base 11, the rotation direction of the base 11, the direction of the magnetic field, and the intensity of the magnetic field to change the magnitude and/or direction of the induced electric field.

In the wafer cleaning apparatus and wafer cleaning method according to the specific embodiments of the present disclosure, a conductive disk is provided in a base for carrying a brush, and the rotation of the base is used to drive the rotation of the conductive disk, so that the conductive disk can cut a magnetic field perpendicular to the disk surface of the conductive disk, thereby forming a potential difference between the center and the edge of the conductive disk to generate an induced electric field by which the electrostatic charges on the surface to be cleaned of the wafer are adsorbed. Therefore, the adsorption of particles in the external environment on the surface to be cleaned is reduced or even avoided, the quality of wafer cleaning is improved, and the yield of wafer products is improved.

The foregoing descriptions are merely preferred embodiments of the present disclosure. It should be noted that, for a person of ordinary skill in the art, various improvements and modifications may be made without departing from the principle of the present disclosure, and these improvements and modifications shall be deemed as falling into the protection scope of the present disclosure.

What is claimed is:

1. A wafer cleaning apparatus, comprising:
   a brush, configured to wash a surface to be cleaned of a wafer;
   a base for carrying the brush, the base having at least one conductive disk, a disk surface of the conductive disk being parallel to the surface to be cleaned, and the base being able to rotate around an axis of the base; and
   a magnetic field generation structure, configured to emit, to the conductive disk, a magnetic field perpendicular to the disk surface of the conductive disk, such that an induced electric field is generated in the conductive disk during a rotation of the base;
   wherein an area of the disk surface of the conductive disk facing the wafer is equal to a cross-sectional area of the base along a disk surface.

2. The wafer cleaning apparatus according to claim 1, wherein the wafer comprises a front side on which a device structure is formed and a back side opposite to the front side, the surface to be cleaned being the back side of the wafer.

3. The wafer cleaning apparatus according to claim 1, wherein there is one conductive disk, and an axis of the conductive disk coincides with the axis of the base.

4. The wafer cleaning apparatus according to claim 3, wherein a shape of the conductive disk is a circle, an ellipse or an arbitrary polygon.

5. The wafer cleaning apparatus according to claim 1, wherein there are multiple conductive disks, and the multiple conductive disks are symmetrically distributed with respect to the axis of the base.

6. The wafer cleaning apparatus according to claim 1, wherein, in a direction perpendicular to the base, a projection of the conductive disk is at least partially located on a periphery of a projection of the brush.

7. The wafer cleaning apparatus according to claim 6, wherein a plurality of the brushes are simultaneously connected to the surface of the base; and
   in a direction perpendicular to the base, the projection of the conductive disk covers the projection of the brush and extends to the outside of the projection of the brush.

8. The wafer cleaning apparatus according to claim 1, wherein a plurality of the brushes are simultaneously connected to the surface of the base, and a projection of the conductive disk is located only between two adjacent brushes.

9. The wafer cleaning apparatus according to claim 1, wherein the conductive disk is located on a surface of the base facing the brush.

10. The wafer cleaning apparatus according to claim 1, wherein the conductive disk is made of an organic conductive material or a metal material.

11. The wafer cleaning apparatus according to claim 1, further comprising:
    a controller, connecting the base to the magnetic field generation structure, and configured to adjust one or more of a rotation speed of the base, a rotation direction of the base, a direction of the magnetic field, and an intensity of the magnetic field.

12. The wafer cleaning apparatus according to claim 1, wherein the brush is a conductive brush.

13. The wafer cleaning apparatus according to claim 12, wherein the brush comprises:
    a washing portion, configured to come into contact with the surface to be cleaned of the wafer, the washing portion is made of a conductive material; and
    a connection portion, configured to connect the washing portion to the base.

14. The wafer cleaning apparatus according to claim 13, wherein the washing portion is made of a blended copolymer of graphene oxide or carbon nanotubes and polyvinyl alcohol.

15. The wafer cleaning apparatus according to claim 14, wherein a mass ratio of graphene oxide or carbon nanotubes to polyvinyl alcohol is 0.05% to 0.25%.

16. A wafer cleaning apparatus, comprising:
    a brush, configured to wash a surface to be cleaned of a wafer;
    a base for carrying the brush, the base having at least one conductive disk, a disk surface of the conductive disk being parallel to the surface to be cleaned, and the base being able to rotate around an axis of the base; and
    a magnetic field generation structure, configured to emit, to the conductive disk, a magnetic field perpendicular to the disk surface of the conductive disk, such that an induced electric field is generated in the conductive disk during a rotation of the base;
    wherein there are multiple conductive disks, and the multiple conductive disks are symmetrically distributed with respect to the axis of the base; and wherein a shape of the conductive disk is a sector, and the multiple conductive disks are in contact with each other to form a circular disk shape.

17. A wafer cleaning apparatus comprising:
a brush, configured to wash a surface to be cleaned of a wafer;
a base for carrying the brush, the base having at least one conductive disk, a disk surface of the conductive disk being parallel to the surface to be cleaned, and the base being able to rotate around an axis of the base; and
a magnetic field generation structure, configured to emit, to the conductive disk, a magnetic field perpendicular to the disk surface of the conductive disk, such that an induced electric field is generated in the conductive disk during a rotation of the base;
wherein the conductive disk is embedded in the base.

18. A wafer cleaning method, comprising:
providing a wafer cleaning apparatus according to claim 1; and
while washing the surface to be cleaned by the brush, driving the base to rotate around the axis of the base and also driving the magnetic field generation structure to emit the magnetic field to generate an induced electric field in the conductive disk during the rotation of the base.

19. The wafer cleaning method according to claim 18, further comprising:
adjusting one or more of a rotation speed of the base, a rotation direction of the base, a direction of the magnetic field, and an intensity of the magnetic field to change the magnitude and/or direction of the induced electric field.

* * * * *